United States Patent [19]
Johnson

[11] Patent Number: 5,376,882
[45] Date of Patent: Dec. 27, 1994

[54] METHOD AND APPARATUS FOR POSITIONING AN INTEGRATED CIRCUIT DEVICE IN A TEST FIXTURE

[75] Inventor: Douglas S. Johnson, Palo Alto, Calif.

[73] Assignee: Sun Microsystems, Inc., Mountain View, Calif.

[21] Appl. No.: 945,479

[22] Filed: Sep. 16, 1992

[51] Int. Cl.$^5$ ............................................. G01R 31/28
[52] U.S. Cl. ................................................. 324/158.1
[58] Field of Search ............. 324/158 F, 158 P, 72.5, 324/158 R; 439/482, 67, 68, 69, 70

[56] References Cited

U.S. PATENT DOCUMENTS

| | | | |
|---|---|---|---|
| 3,654,585 | 4/1972 | Wickersham | 324/158 F |
| 4,506,938 | 3/1985 | Madden | 324/158 F |
| 4,560,216 | 12/1985 | Egawa | 324/158 F |
| 4,899,107 | 2/1990 | Corbett et al. | 324/158 F |
| 4,940,935 | 7/1990 | Riley | 324/158 F |

OTHER PUBLICATIONS

"Flexible Vacuum Adjustable Load Module", p. 23, published by Flexible Interface, 1992.
"Heating and Cooling", p. 49, published by Flexible Interface, 1992.

Primary Examiner—Vinh Nguyen
Attorney, Agent, or Firm—Erwin J. Basinski

[57] ABSTRACT

A method and an apparatus are disclosed for positioning an integrated circuit chip to be tested on a device-under-test ("DUT") interface board without using a hold-down plate and for attaching this interface board to a feed-through interface module so that the device being tested makes abutting contact with the feed-through interface module and so that the contact pins of the device being tested make abutting electrical contact with contact pin sockets on the DUT interface board. This arrangement provides a path for heat and ion dissipation from the chip being tested in a simple and elegant manner which also minimizes potential damage to the chip.

21 Claims, 4 Drawing Sheets

METHOD AND APPARATUS FOR POSITIONING AN INTEGRATED CIRCUIT DEVICE IN A TEST FIXTURE

BACKGROUND OF THE INVENTION

1. Field of the Invention

The present invention relates to the field of integrated circuit testing systems. More particularly, it relates to methods and apparatus for efficiently positioning an integrated circuit chip as a device under test in a multipin feed-through interface module/test socket fixture.

2. Background

As integrated circuits (ICs) have become more complicated, means for testing IC chips have similarly become more complicated and more expensive. These chips often have several hundred connector pins which challenge the tester to provide complete and secure electrical contact with each pin, in a non-destructive way. Such chips inherently generate significant amounts of heat which must be dissipated. It is common that only a few prototype chips are fabricated for intensive testing and rework, until satisfactory results are achieved. Accordingly, cost effective chip development requires chip test fixtures that provide for: (1) non-destructive, easy installation and removal of the chip from the test device; (2) general emulation of the chip's normal operating environment in terms of pin connections, power applied, output measurement and heat dissipation; and (3) means to negate the effects of special conditions related to the test device itself such as special power application requirements and related special grounding, special heat dissipation, etc.

One type of known IC testing system is the Schlumberger IDS5OOOPlus e-beam probe station (the "probe station"). Referring to FIG. 1, the probe station uses a scanning electron microscope (SEM) 10 to image the IC or device under test ("DUT") 12 as well as detect variations in the electric potential of the surface of the DUT 12. These surface potentials are then translated into device signal wave forms by the computer controller 14 and displayed on the color monitor 16 in a manner similar to that seen on an oscilloscope. Test engineers viewing these wave forms are thereby able to compare the DUT's actual performance characteristics with corresponding design criteria. In order to test a chip in this type of test system, the chip must be mounted on a DUT interface board which is then attached to a feed-through interface Module 20. The feed-through interface Module 20 is then positioned to form the top of the vacuum chamber 22 in such a way as to place the DUT 12 directly in line with the electron stream generated by the SEM 10. Schlumberger produces a number of other models of such test systems, such as the IDS 3000, IDS 5000, and IDS 5000HX, all of which use the same basic test fixtures.

A type of feed-through interface Module called a Universal Load Module is sold by Schlumberger for use with their probe station. Referring now to FIG. 2, the Schlumberger Universal Load Module 30 forms the top of the vacuum chamber and has 600 spring-loaded 'pogo-pins' 31 which make contact to the DUT interface board 34. These pogo-pins 31 provide a signal path from the DUT interface board 34 through the Universal Load Module 30 to the test equipment outside of the vacuum chamber.

The DUT 12 fits into some type of mounting 36 on the DUT interface board 34. This mounting 36 must provide both electrical contact to the DUT pins 38 as well as mechanical support to the DUT 12 as the test unit is moved around.

A particular test system configuration combines a 600-pin Universal Load Module from Schlumberger 30 with a DUT interface board 34 from Fresh Test Technology of Gilbert, Ariz. This particular arrangement is specific to integrated circuits in cavity-down PGA (pin grid array) packages, but may be adapted to other cavity-down package configurations.

Existing mounting socket options which meet the working distance operating parameters of such test devices are of two basic types;

(1) Positive insertion force sockets; and
(2) Zero insertion force sockets (spring sockets).

Positive insertion force PGA sockets provide both electrical contact and mechanical support through the same mechanism. Their basic design is a cylinder which fits around the DUT pin and holds the pin through some flexible mechanism which contacts the sides of the pin. Examples of such sockets are Swart Interconnect model RC-PGA-11-10-084-M4-01L-17 or Hypertac versions such as Swart Interconnect model SI-337-Y4-AH-20-F.

Zero insertion force PGA sockets of the type made by Fresh test Technology, provide electrical contact, but do not provide mechanical support. Their basic design is also a cylinder which fits around the DUT pin, but does not contact it along the sides. Rather, a small spring-loaded contact is located in the bottom of the cylinder which contacts only the bottom of the DUT pin. Thus the device is free to move up or down in the cylinder with 'zero force'.

Because of the high pin counts of some PGA IC's, the positive-insertion force socket of the Swart Interconnect type becomes undesirable due to the large forces required to insert and extract the devices from the sockets. For example, a 300 pin IC inserted into positive-insertion force sockets of 1 oz. each would experience over eighteen pounds of force. In the test and analysis scenario, such insertion and extraction can take place on an hourly basis, frequently subjecting the devices to risk of physical damage. Thus the importance of the zero-insertion force socket becomes apparent. However, the nature of zero-insertion force sockets is that the device requires some form of mechanism to compress the DUT pins onto the spring-loaded contacts in the base of the socket and to hold it there as a mechanical support. The mechanism provided by Fresh Test Technology with their spring socketed DUT boards is referred to as a "hold-down" or hold-down plate. Referring again to FIG. 2, the hold-down 40 consists of a stainless steel plate with holes 42 drilled at each corner and four screws 44 with corresponding 'PEM' nuts 46 to attach the hold-down 40 to the DUT interface board 34 and compress the pins 38 of the DUT 12 into the spring sockets 36.

Shortcomings

There are at least four problems with using the hold-down plate 40 as described above.

1. Uniform force on top of package

The hold-down plate 40 does not provide any means of regulating the forces applied to the top of the DUT where the two come together. Tightening one corner of the hold-down a little too much can cause that corner of the IC package to crack and break when the other corners are subsequently tightened. In the early stages of development testing, a broken IC package can result in months of delay.

2. Planarity

The hold-down plate 40 does not provide any planar reference for the IC relative to the SEM chamber or column. Thus while moving the SEM viewing region to different areas of the IC surface, the distance of the surface to the SEM column can change. This will require the operator to focus the image each time the viewing region is changed. This not only lengthens total test time but results in a discontinuity of test procedures.

3. Thermal dissipation

The primary means of dissipating heat generated by an IC during normal use is through the use of a heatsink, which provides a large surface area over which the ambient air can absorb and dissipate the heat. In the vacuum of the SEM chamber, however, there is no ambient air and the only thermal dissipation is by a secondary means through the DUT pins and into the DUT board, to the feed-through interface module, and finally to the outside environment, This may result in unsatisfactory dissipation and excessive heat build-up which can skew test results at certain temperature levels and damage the DUT.

These three problems require an inordinate amount of adjusting of the hold-down device, which requires that an operator stop testing, open up the vacuum chamber, make adjustments and then close the chamber and reinitialize the test procedure. This process not only lengthens the test cycle with the corresponding costs but more importantly creates the possibility for damaging the DUT itself each time the hold-down screws are tightened. Such damage can add weeks or months to the test cycle if only a limited number of chips are available for testing.

4. Electrical Charge Build-up

An additional shortcoming of the Schlumberger probe unit is the fact that the DUT interface board mounting system provides no means for dissipating the electrical charge which can build up on the DUT during testing. By design, IC device surfaces are insulators and are thereby subject to accumulating electrical charge from the electron beam during SEM imaging. This accumulation of charge is counterproductive to the imaging and signal acquisition efforts of the electron beam and its detection devices. If the electrical charge created on the DUT surface by the scanning electron beam builds up without some means of bleeding off or dissipating the surface electron charge, the image of the circuit of the DUT is blanked-out on the tester viewing screen by the "bloom" caused by this charge. No further test observations are possible until the electron charge is somehow dissipated.

The method and apparatus of the present invention provides a solution to these problems. By providing the appropriate abutting contact between the DUT and the food-through interface center block, the center block provides pressure on the DUT to achieve abutting electrical contact between the DUT pins and the test sockets without destructive stress on the DUT, and at the same time provides a path for heat and ion dissipation.

SUMMARY OF THE INVENTION

The present invention is a method and apparatus for positioning an integrated circuit chip in a multi-pin test socket fixture in the vacuum chamber of a test device which provides for heat and ion dissipation in a simple and elegant way, while minimizing damage to the chip.

In an integrated circuit test system, a method and apparatus are disclosed for positioning the chip device to be tested on a device-under-test ("DUT") interface board without using a hold-down plate and for attaching this interface board to a feed-through interface module so that the device being tested makes abutting contact with the center block of the feed-through interface module and so that the contact pins of the device being tested make abutting electrical contact with the DUT interface board. These contacts provide a means for the heat and ion build-up on the chip to be efficiently dissipated. The hold-down plate is no longer required thereby preventing potential damage to the chip from incorrect tightening or the screws on the plate.

The method and apparatus of the invention also includes a spacer coupled to the device being tested and biased to make abutting contact with the center block of the feed-through interface module. The use of a spacer provides a simple mechanism to accommodate chips which have attached heat-sink screws. The spacer also provides a means for accommodating chips with varying thicknesses by varying the thickness of the spacer needed to assure abutting contact is made with the center block. The thickness of the spacer is a function of the thickness of the feed-through interface center block, the thickness of the device being tested, and the overall distance from the top of the feed-through interface center block to the top of the DUT interface board in the mounted position.

Further provision is made for electrical connections to allow a signal path from the DUT interface board through the feed-through interface module. Also provision is made for the use of a plurality of spring sockets on the DUT interface board for making abutting electrical contact with the pins of the device being tested.

The method and apparatus of the present invention which includes the use of zero insertion force spring sockets on the DUT interface board, the use of a spacer of appropriate thickness and the use of a feed-through interface center block of corresponding thickness provides a simple and elegant way to test a chip quickly and easily, dissipate any heat and ion build-up on the chip, and with minimal chance of damaging the chip in the process.

DESCRIPTION OF THE DRAWINGS

The features and advantages of the system of the present invention will be apparent from the following description in which.

DESCRIPTION OF THE PREFERRED EMBODIMENT

A. Definitions

A "spacer" is defined herein as a device for attaching to the DUT which will make abutting contact with a feed-through interface center block, and which is made of an appropriate material in consideration of electrical and thermal conductance as well as ease of machining. In the preferred embodiment of the present invention, aluminum was used to fabricate the spacer.

"Spring sockets" are defined as zero insertion force PGA sockets of the type made by Fresh Test Technology, which contains spring-loaded contacts in the bottom of the pin cylinders which contacts the bottom of the DUT pin.

The "test device" is a Scanning Electron Microscope test system configured for testing multi-pin integrated circuit chips.

B. General Features

The present invention is a method and apparatus for positioning an integrated circuit chip in a multi-pin test socket fixture in the vacuum chamber of a test device.

Figure 3:
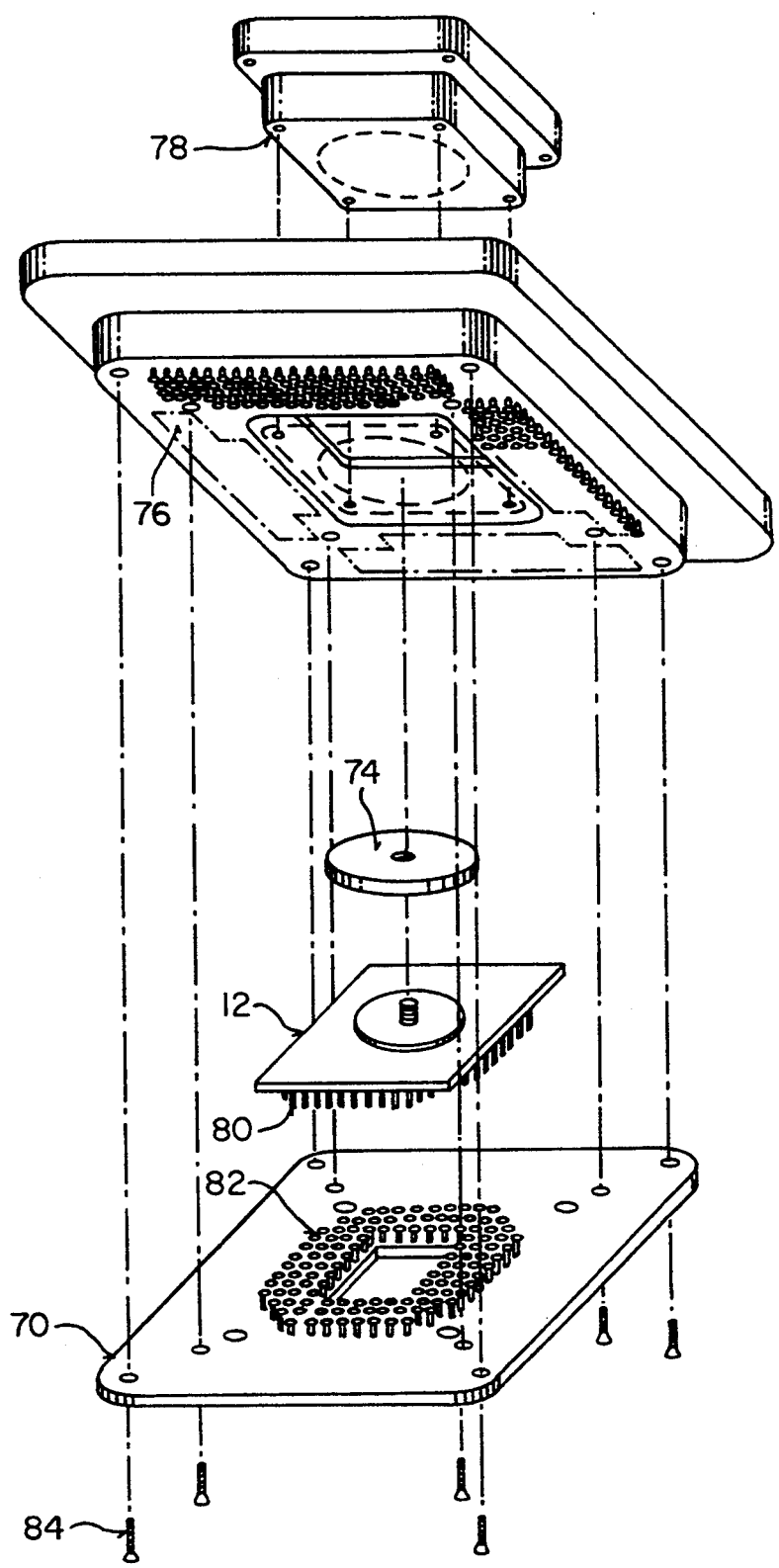
FIG. 3 illustrates the method of the present invention mounting configuration of the DUT using a spacer attached to the DUT in lieu of the hold-down plate
Figure 4:
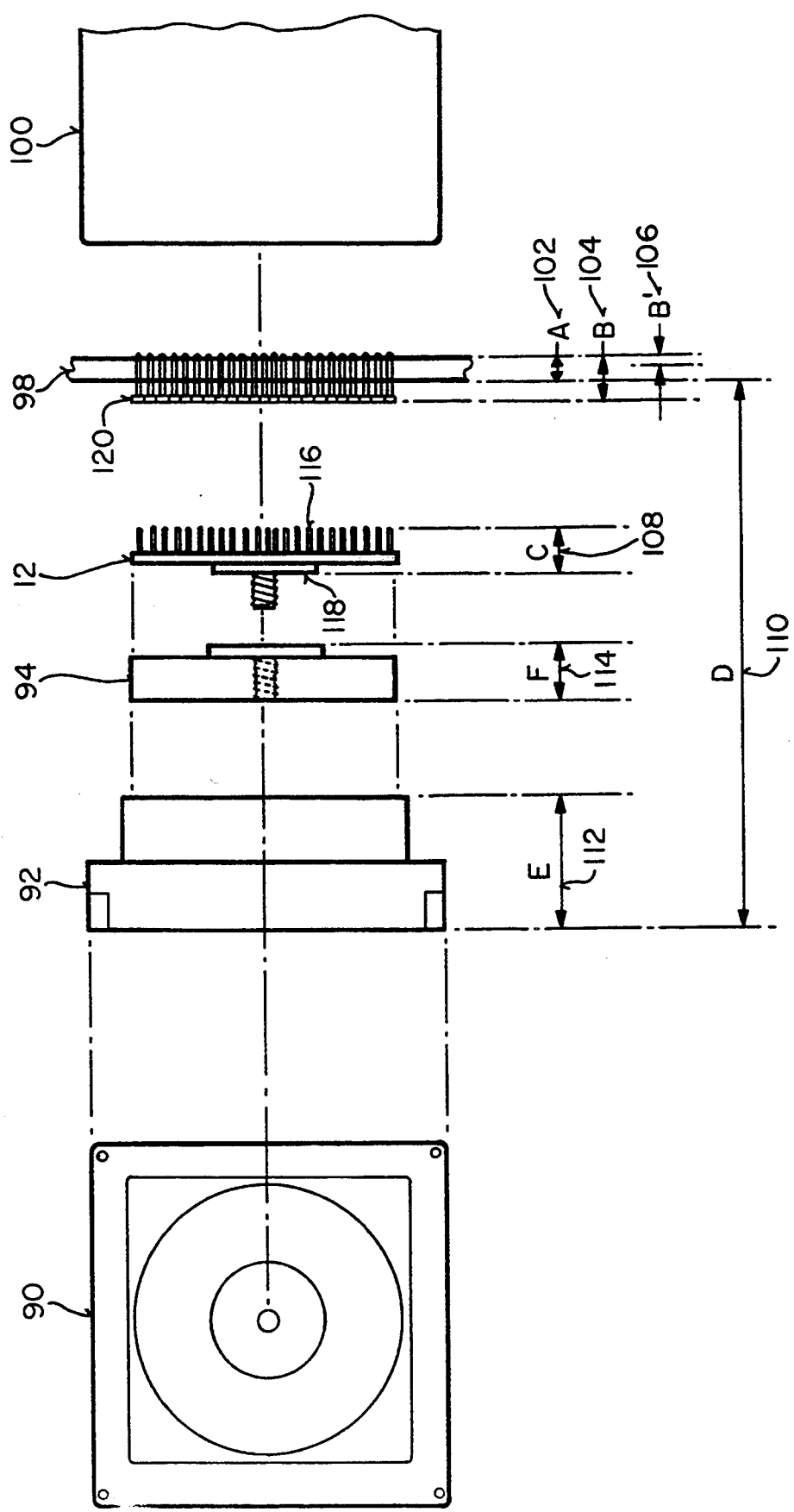
FIG. 4 illustrates the important dimensions for selecting the thickness of the feed-through interface center block and the thickness of a spacer if a spacer is used.

FIGS. 3 and 4 illustrate a number of general features of the present invention, including an exemplary preferred embodiment of a test set-up using a spacer without the hold-down mechanism, and a description of the thickness calculations for fabricating the spacer in an exemplary embodiment.

Figure 1:
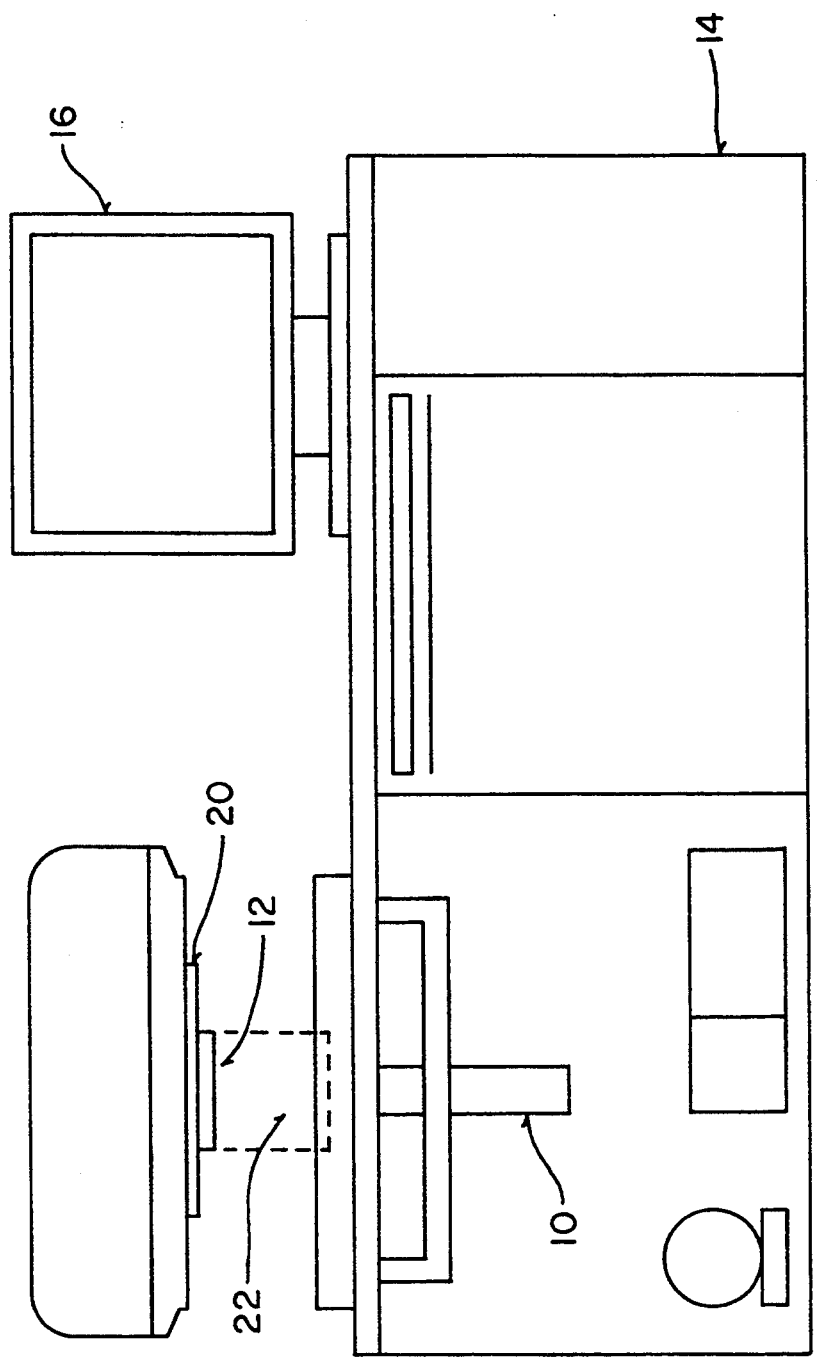
FIG. 1 illustrates a general block diagram of a SEM type IC chip tester.
Figure 2:
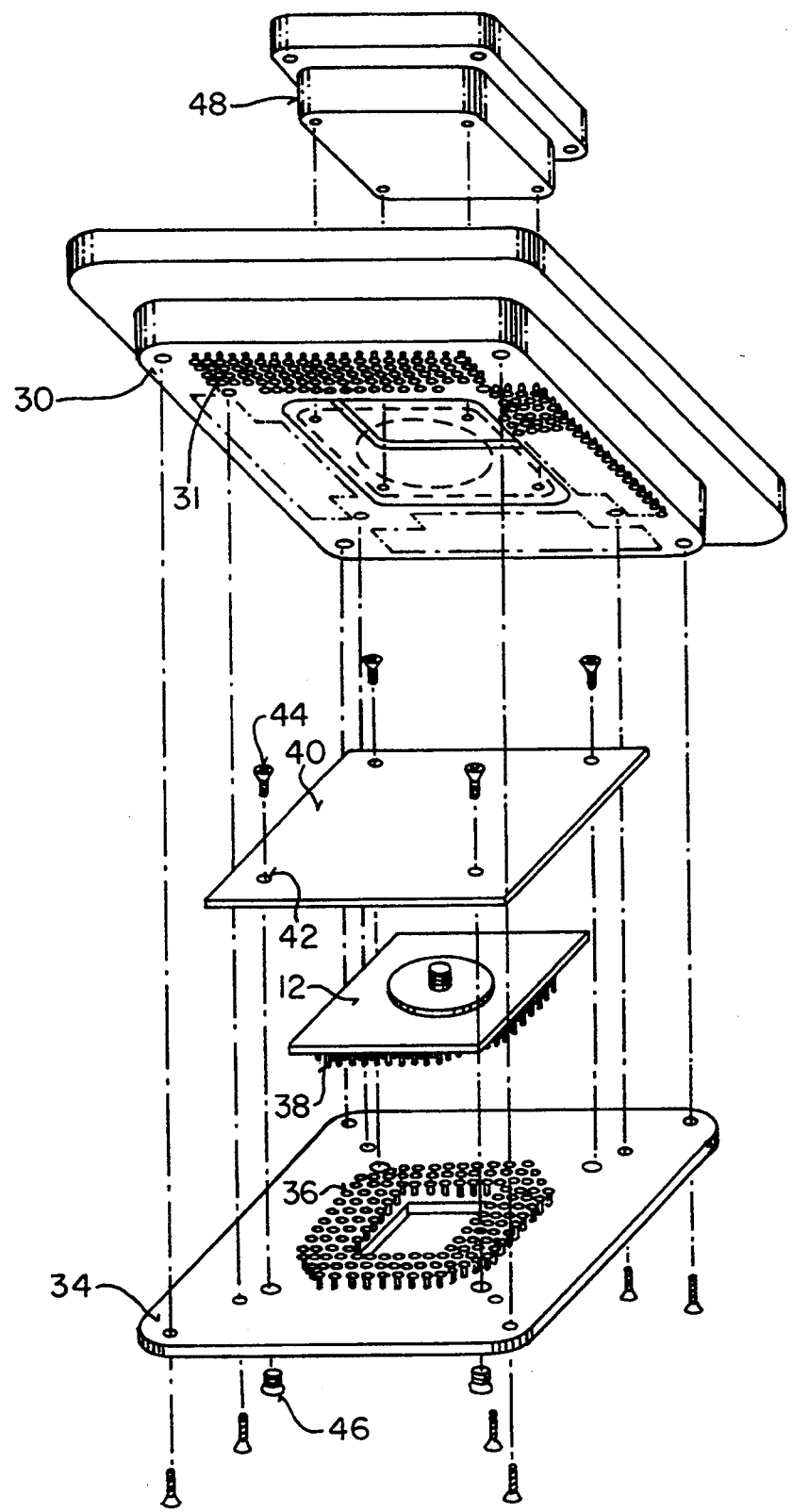
FIG. 2 illustrates the prior art configuration of the mounting of a DUT on a universal load module using a hold-down.

Referring now to FIG. 3, the feed-through interface center block 78 is machined to a thickness appropriate to make abutting contact with the spacer 74. The feed-through interface center block 78 fits into a recess in the top of the feed-through interface module 76 such that the top of the center block 78 is flush with the top of the module 76. The feed-through interface center block 78 is attached to the feed-through interface module 76 by means of four screws (not shown). The thickness of the spacer 74 is also adjusted so that in combination with the feed-through interface center block 78 thickness, the compression of the DUT pins 80 into the Spring sockets 82 is just adequate to make electrical contact without undue pressure on the DUT 12 or the DUT pins 80. The spacer 74 is mated to the DUT 12 either by screwing it on the heat-sink attachment as shown, or by bonding the spacer 74 to the DUT 12 if no screw attachment is possible. In the configuration shown, the spacer 74 is attached to the DUT 12, the spacer-DUT 74-12 combination is then seated on the DUT board 70 in such a way that the DUT pins 80 are seated in the Spring sockets 82 attached to the DUT board 70. The DUT board 70 is then attached to the feed-through interface module 76 by means of the eight screws 84. As the eight screws are tightened, the center block makes abutting contact with the spacer 74 and compresses the DUT 12 into the spring sockets 82, whereby physical contact to the top of the DUT 12 and electrical contact to the DUT pins 80 are assured. Note that the hold-down plate (40 in FIG. 2) and the related screws 44 and PEM nuts 46 are no longer needed in the configuration of the invention shown in FIG. 3.

In the preferred embodiment of the present invention, a solid spacer is attached to the IC which is the DUT; in place of the normal heat-sink. The spacer is made with a thickness appropriate to the particular DUT package thickness as explained more fully below. By attaching the spacer of sufficient thickness to the DUT, physical contact is made between the DUT and the roof of the vacuum chamber (i.e. the center block of the feed-through interface module). When the spacer and the feed-through interface module center block are made of sufficient thickness, the DUT is made to automatically and reliably compress into the spring sockets as the DUT board is attached and tightened onto the feed-through interface module. The compression of the DUT into the spring sockets is self limiting since the compression stops once the DUT board has made contact with the mounting surface of the feed-through interface module. This arrangement provides a uniform application of force on the DUT, a planar reference for the DUT relative to the vacuum chamber and an excellent path of thermal and electrical conduction to dissipate heat and ion build-up generated during test. Furthermore this arrangement replaces the cumbersome hold-down plate method formerly used to position the DUT.

Referring now to FIG. 4, the method or selecting the thickness of the spacer and feed-through interface module center block is described for an exemplary case where the spacer is configured for a threaded heat-sink attachment package. The limiting dimension in the Schlumberger IDS 5000 test system of the preferred embodiment is the distance from the top of the feed-through interface center block 92 to the top of the DUT board 98. This distance is designated D 110. Note that the top of the feed-through interface center block 92 is flush with the top of the feed-through interface module (76 in FIG. 3) so that in the general case, these two items may be a single piece of equipment and the value D is still the same. In any similar system this distance will be fixed and will control the thickness F 114 of the spacer 94 and the thickness E 112 of the feed-through interface center block 92 according to the following formula $$E+F=D+(A-B')-C.$$

where
A = DUT board thickness 102
B = Spring socket height (total external) 104
B' = the internal spring socket height when compressed 106 (This assumes that the bottom of the spring sockets 120 are flush with the bottom of the DUT board 98)
C = the Device 12 height (from end of pins to top of surface for heat-sink contact) 108
D = Feed-through module height (from top of DUT board to top of mounted centerblock) 110.
E = Centerblock thickness 112.
F = Spacer thickness 114.

Note that E combined with F is the: critical user-selected dimension and that F can actually have a thickness equal to zero (i.e. no spacer used). In practice, because many DUTs have attached heat-sink screws it is more practical to use a spacer. Also, it is more convenient to change spacers when package thicknesses change, than it is to remachine or change a center block.

As an example of the use of the above calculation, the following describes a specific case used with the present invention. Referring again to FIG. 4 and the previous discussion, the values related to a Texas Instruments/Sun Microsystems SuperSPARC processor chip under test are as follows:
A = 0.126 inches
B' = 0.045 inches
C = 0.302 inches
D = 1.214 inches
Accordingly, $E+F=D+(A-B')-C=0.993$ inches. In this case, it was deemed appropriate to use a spacer and not a one-piece center block for the following reasons:

(1) this particular processor chip has a heat sink of thickness 0.293 inches with a threaded mounting on the chip. By duplicating the heat-sink thickness as the spacer's thickness a set-up is obtained which can accommodate a similar chip with a permanently attached heat-sink. Although such a heat-sink would make a poor spacer in terms of thermal and electrical conductance, it is better to test the chip in that configuration than not testing it at all;

(2) the spacer accommodates the threaded stud on the top of the chip; and (3) the spacer allows a single machining of the thickness of the center block, while accommodating other chip devices with variable package heights by simply changing the spacer thickness and using the same center block.

In this particular example, a spacer thickness of 0.293 inches was chosen which necessitated a center block thickness of 0.700 inches. That is, E+F was equal to 0.993 inches, and so choosing the spacer to be 0.293 inches gives E=0.993−F or 0.993−0.293=0.700 inches for the center block.

Although the invention has been described in relation to exemplary implementations, together with variations and extensions thereof, other implementations, modifications, variations and extensions are within the scope of the invention. The invention is therefore not limited by the description contained herein or by the drawings, but only by the claims.

What is claimed is:

1. In an integrated circuit ("IC") test system, which includes at least one IC chip having a plurality of contact pins (the "DUT"), and which includes a feed-through interface module, and which also includes an interface board for mounting the DUT, a method for positioning the DUT in the test system comprising the following steps:
   a. positioning DUT on the DUT interface board;
   b. positioning a conductive spacer in contact with the DUT; and
   c. attaching the DUT interface board with the DUT to the feed-through interface module so that the conductive spacer makes abutting contact with the feed-through interface module, and the DUT contact pins make abutting electrical contact with the DUT interface board.

2. The method according to claim 1 wherein the conductive spacer connected to the DUT makes abutting contact with a center block of the feed-through interface module when the DUT interface board is attached to the feed-through interface module.

3. The method according to claim 2 wherein the test system is a Schlumberger IDS5000Plus e-beam probe station.

4. The method according to claim 3 wherein the feed-through interface module is a universal load module containing a plurality of electrical contacts which make abutting contact with the DUT interface board, providing a signal path from the DUT interface board through the universal load module.

5. The method according to claim 4 wherein the DUT interface board contains a plurality of spring sockets for making abutting electrical contact with the contact pins of the DUT.

6. The method according to claim 5 comprising the additional step of adjusting, said spacer's thickness whenever a new DUT is inserted into said test system, based upon said new DUT's thickness.

7. The method according to claim 6 wherein a combined thickness of the spacer and thickness of the feed-through interface module is adjusted as a function a distance between a top of the feed-through interface module to a top of the DUT board and the new DUT's thickness.

8. The method according to claim 2 wherein the DUT interface board contains a plurality of spring sockets.

9. The method according to claim 8 wherein the DUT contact pins make abutting electrical contact with the DUT interface board spring sockets.

10. The method according to claim 9 comprising the additional step of adjusting a combined thickness of a spacer and thickness of the feed-through interface module as a function of the distance between a top of the feed-through interface module to a top of the DUT interface board in a mounted position, and the DUT's thickness, wherein the spacer makes abutting contact with an inner surface of the center block of the feed-through interface module.

11. The method according to claim 1 wherein the feed-through interface module further comprises a feed-through interface center block.

12. In an integrated circuit ("IC") test system, which includes at least one IC chip having a plurality of contact pins referred to as a device under test ("DUT"), and which includes a feed-through interface module, an apparatus for positioning the DUT in the test system comprising:
   a. a DUT interface board coupled to the DUT;
   b. a conductive spacer mounted in contact with the DUT; and
   c. the feed-through interface module connected to the DUT interface board, so that the conductive spacer makes abutting contact with the feed-through interface module, and the DUT contact pins make abutting electrical contact with the DUT interface board.

13. The apparatus according to claim 12 wherein physical connections for discharging heat generated by the DUT and for discharging electrical charge which may have built up on the DUT are provided through the spacer's abutting contact to a center block of the feed-through interface module.

14. The apparatus according to claim 12 wherein the DUT interface board comprises a plurality of spring sockets.

15. The apparatus according to claim 14 wherein the DUT contact pins make abutting electrical contact with the DUT interface board spring sockets.

16. The apparatus according to claim 15 wherein the spacer's thickness has been adjusted so that a combined thickness of the spacer and thickness of the feed-through interface module is a function of a distance between a top of the feed-through interface module to a top of the DUT board and the DUT's thickness, thereby permitting said abutting contact without excessive pressure on said DUT contact pins.

17. The apparatus according to claim 12 wherein the feed-through interface module further comprises a feed-through interface center block, which is designed to make abutting electrical and thermal contact with said spacer.

18. The apparatus according to claim 12 wherein the test system is a Schlumberger IDS5000Plus e-beam probe station.

19. The apparatus according to claim 18 wherein the feed-through interface module is a universal load module having a center block and containing a plurality of electrical contacts which make abutting contact with the DUT interface board, providing a signal path from the DUT interface board through the universal load module.

20. The apparatus according to claim 19 wherein the DUT interface board contains a plurality of spring sockets for making abutting electrical contact with the contact pins of the DUT.

21. The apparatus according to claim 20 wherein the spacer's thickness has been adjusted so that a combined thickness of the spacer and thickness of the feed-through interface center block is a function of a distance between a top of the feed-through interface centerblock to a top of the DUT board, and the DUT's thickness, thereby permitting said abutting contact without excessive pressure on said DUT contact pins.

* * * * *